US012362206B2

(12) United States Patent
Vasquez et al.

(10) Patent No.: US 12,362,206 B2
(45) Date of Patent: Jul. 15, 2025

(54) FORELINE ASSEMBLY FOR QUAD STATION PROCESS MODULE

(71) Applicant: Lam Research Corporation, Fremont, CA (US)

(72) Inventors: Miguel Benjamin Vasquez, Portland, OR (US); Emile Draper, Molalla, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 726 days.

(21) Appl. No.: 17/604,934

(22) PCT Filed: Apr. 14, 2020

(86) PCT No.: PCT/US2020/028160
§ 371 (c)(1),
(2) Date: Oct. 19, 2021

(87) PCT Pub. No.: WO2020/214618
PCT Pub. Date: Oct. 22, 2020

(65) Prior Publication Data
US 2022/0208575 A1  Jun. 30, 2022

Related U.S. Application Data

(60) Provisional application No. 62/836,501, filed on Apr. 19, 2019.

(51) Int. Cl.
*H01L 21/67* (2006.01)
*H01L 21/677* (2006.01)

(52) U.S. Cl.
CPC .. *H01L 21/67196* (2013.01); *H01L 21/67161* (2013.01); *H01L 21/67167* (2013.01);
(Continued)

(58) Field of Classification Search
CPC ......... H01L 21/67196; H01L 21/67161; H01L 21/67167; H01L 21/67184; H01L 21/6719; H01L 21/67745; C23C 16/4412
See application file for complete search history.

(56) References Cited

U.S. PATENT DOCUMENTS 6,228,773 B1   5/2001   Cox
6,532,069 B1   3/2003   Otsuki et al.
(Continued)

FOREIGN PATENT DOCUMENTS

CN   113728421      11/2021
JP   S61263118 A    11/1986
(Continued)

OTHER PUBLICATIONS

Korean Office Action for Korean App. No. 10-2021-7037753 mailed Dec. 8, 2023.
(Continued)

*Primary Examiner* — Aiden Lee

(57) ABSTRACT

A foreline assembly for a quad station process module (QSM) is provided. In some examples, a foreline assembly comprises four inlets each connectable to a chamber port of a process module of the QSM and an outlet connectable directly or indirectly to a vacuum source. A first foreline bifurcation is disposed proximate the outlet of the foreline assembly. Two second bifurcations are each disposed between the first foreline bifurcation and a respective pair of the inlets. The first and second bifurcations divide the foreline assembly into three sections. A respective diameter of a foreline in each section increases stepwise at a respective bifurcation in a direction of gas flow from at least one of the inlets to the outlet of the foreline assembly and is constant within a respective section of the foreline assembly.

15 Claims, 10 Drawing Sheets

(52) U.S. Cl.
CPC .... *H01L 21/67184* (2013.01); *H01L 21/6719* (2013.01); *H01L 21/67745* (2013.01)

(56) References Cited

U.S. PATENT DOCUMENTS

| | | | | |
|---|---|---|---|---|
| 2008/0124462 | A1* | 5/2008 | Waghray | .............. C23C 16/26 427/249.2 |
| 2010/0288369 | A1 | 11/2010 | Chang et al. | |
| 2012/0114836 | A1* | 5/2012 | Arno | .............. C23C 16/14 118/712 |
| 2012/0222813 | A1* | 9/2012 | Pal | .............. C23C 16/4412 156/345.31 |
| 2018/0108529 | A1 | 4/2018 | Lee et al. | |

FOREIGN PATENT DOCUMENTS

| | | | |
|---|---|---|---|
| JP | H6216075 | A | 8/1994 |
| JP | 200030894 | A | 1/2000 |
| JP | 2000030894 | A * | 1/2000 |
| KR | 20070121614 | A | 12/2007 |
| KR | 101036188 | B1 | 5/2011 |
| KR | 101036188000 | | 5/2011 |
| KR | 20120084063 | A | 7/2012 |
| KR | 101455772 | B1 | 11/2014 |
| TW | 201104778 | A | 2/2011 |

OTHER PUBLICATIONS

"International Application Serial No. PCT US2020 028160, International Preliminary Report on Patentability mailed Oct. 28, 2021", 7 pages.

Korean Office Action for Korean App. No. 10-2021-7037753 mailed Mar. 22, 2023.

Taiwanese Office Action for Taiwanese Application No. 109112472 dated Jan. 17, 2024.

International Application Serial No. PCT/US2020/028160, International Search Report mailed Jul. 24, 2020, 4 pgs.

International Application Serial No. PCT/US2020/028160, Written Opinion mailed Jul. 24, 2020, 5 pgs.

Korean Office Action for Korean App. No. 10-2021-7037753 mailed Jul. 25, 2023.

* cited by examiner

FORELINE ASSEMBLY FOR QUAD STATION PROCESS MODULE

CLAIM OF PRIORITY

This application is a U.S. National Stage Filing under 35 U.S.C. 371 from International Application No. PCT/US2020/028160, filed on April 14. 2020, and published as WO 2020/214618 A1 on Oct. 22, 2020, which claims the benefit of priority to U.S. Provisional Patent Application No. 62/836,501, filed on Apr. 19, 2019, each of which is incorporated by reference herein in its entirety.

FIELD

The present disclosure relates to a foreline assembly and configuration, and more particularly to a foreline assembly configured for a quad station process module (QSM) in semiconductor manufacturing applications.

BACKGROUND

A foreline assembly is typically connected to a vacuum source underneath a processing chamber or module and evacuates exhaust gasses from the chamber during wafer processing. Conventional configurations of foreline assemblies can make servicing lower chamber hardware very difficult. The lower portions of some modules get very crowded which makes adding new hardware difficult. In particular, some lower chamber hardware is especially difficult to work on because of a pedestal lift orientation which is dictated by the foreline geometry and location.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The present disclosure relates generally to a foreline assembly for a quad station process module (QSM). In some embodiments, a foreline assembly comprises four inlets each connectable to a chamber port of a process module of the QSM; an outlet connectable directly or indirectly to a vacuum source; a first foreline bifurcation disposed proximate the outlet of the foreline assembly; two second bifurcations, each disposed between the first foreline bifurcation and a respective pair of the inlets; the first and second bifurcations dividing the foreline assembly into three sections, a first section extending from the inlets to the two second bifurcations, a second section extending from the two second bifurcations to the first bifurcation, and a third section extending from the first bifurcation to the outlet of the foreline assembly; wherein a respective diameter of a foreline in each section: increases stepwise at a respective bifurcation in a direction of gas flow from at least one of the inlets to the outlet of the foreline assembly, and is constant within a respective section of the foreline assembly.

In some examples, a diameter of a foreline in the first section is in the range 38.1 mm (approximately 1.5 inches) to 63.5 mm (approximately 2.5 inches), a diameter of a foreline in the second section is in the range 63.5 mm (approximately 2.5 inches) to 88.9 mm (approximately 3.5 inches), and a diameter of a foreline in the third section is in the range 88.9 mm (approximately 3.5 inches) to 114.3 mm (approximately 4.5 inches). In some examples, the diameter of the foreline in the first section is 50.8 mm (approximately 2 inches), the diameter of the foreline in the second section is 76.2 mm (approximately 3 inches), and the diameter of the foreline in the third section is 101.6 mm (approximately 4 inches).

In some examples, the foreline assembly further comprises a T-piece connector provided at each of the second bifurcations. In some examples. the T-piece connector includes outwardly converging conical sections that transition the diameter of a foreline in the first section to the diameter of a foreline in the second section. In some examples, a separation distance between the T-piece connector and an underside of the QSM is configured to accommodate a component between the T-piece and underside of the QSM.

In some examples, the first section of the foreline assembly includes four forelines each including three substantially right-angled elbows disposed at intervals along the forelines. In some examples, each elbow is provided between a respective inlet and a respective second bifurcation. In some examples, the forelines in the first section are generally continuous and devoid of separable joints or unions.

In some examples, the second section of the foreline assembly includes two forelines that each include one substantially right-angled elbow disposed between the first and a respective second bifurcation. In some examples, the foreline assembly further comprises a separable union provided at or towards an upper end of each right-angled elbow. In some examples, each union includes two opposed flanges. In some examples, the opposed flanges each lie in a horizontal plane when fitted to the QSM.

In some examples, the third section of the foreline assembly includes a plenum chamber, the plenum chamber provided at the first bifurcation.

In some examples, the foreline assembly further comprises a spool piece, the spool piece including one or more of a slow-pump inlet, a tetraethyl orthosilicate or tetraethoxysilane (TEOS divert, a gas box divert, a precursor or other divert, a Hastings gauge port, and a bellows.

BRIEF DESCRIPTION OF THE DRAWINGS

Some embodiments are illustrated by way of example and not limitation in the views of the accompanying drawing.

DESCRIPTION

Figure 2:
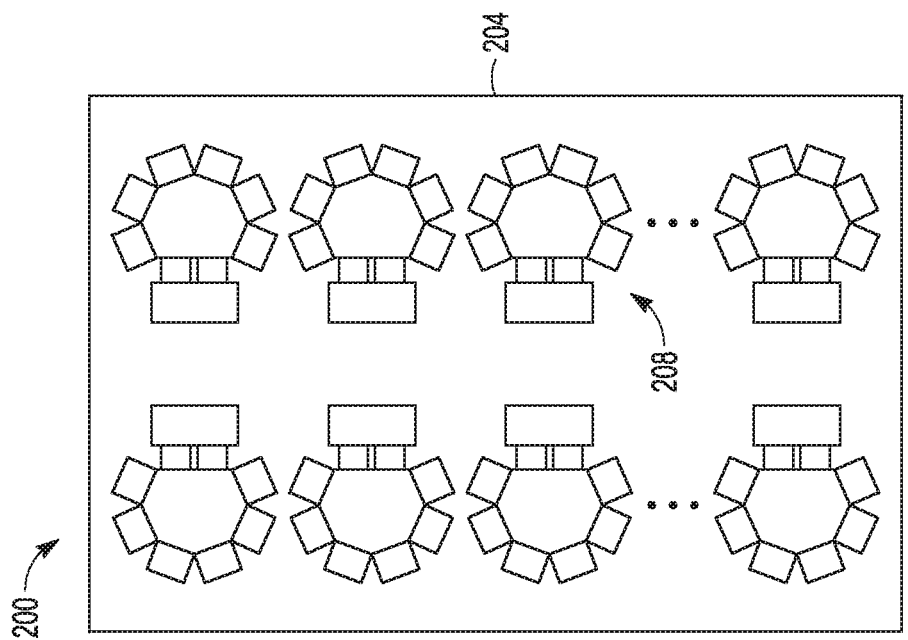
FIGS. 1-4 show schematic views of substrate processing tools in which example foreline assemblies of the present disclosure may be deployed.

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present disclosure may be practiced without these specific details.

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2019-2020. All Rights Reserved.

A substrate processing system may be used to perform deposition, etching and/or other treatment of substrates such as semiconductor wafers. During processing, a substrate is arranged on a substrate support in a processing chamber of the substrate processing system. During etching or deposition, gas mixtures including one or more etch gases or gas precursors, respectively, are introduced into the processing chamber and plasma may be struck to activate chemical reactions.

The substrate processing system may include a plurality of substrate processing tools arranged within a fabrication room. Each of the substrate processing tools may include a plurality of process modules. Typically, a substrate processing tool includes up to six process modules.

Figure 1:
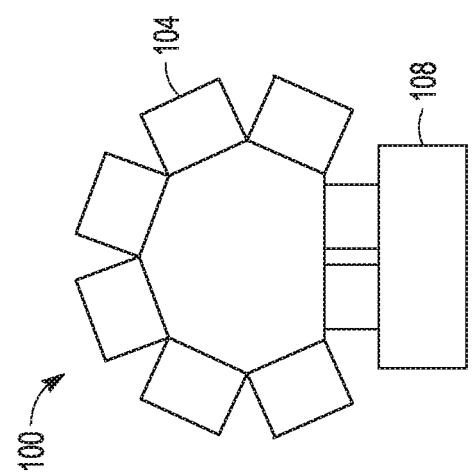

Referring now to FIG. 1, a top-down view of an example substrate processing tool 100 is shown. The substrate processing tool 100 includes a plurality of process modules 104. In some examples, each of the process modules 104 may be configured to perform one or more respective processes on a substrate. Substrates to be processed are loaded into the substrate processing tool 100 via ports of a loading station of an equipment front end module (EFEM) 108 and then transferred into one or more of the process modules 104. For example, a substrate may be loaded into each of the process modules 104 in succession. Referring now to FIG. 2, an example arrangement 200 of a fabrication room 204 including a plurality of substrate processing tools 208 is shown.

Figure 3:
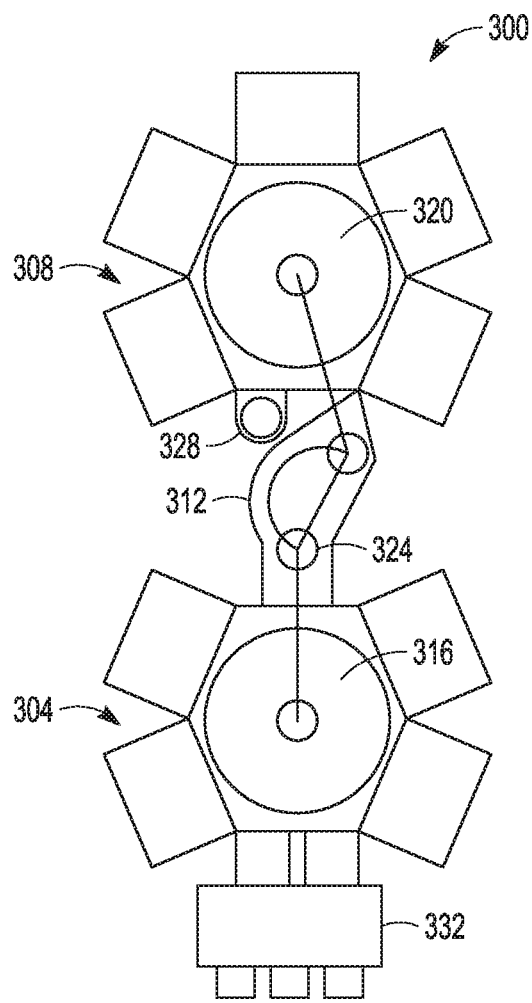

FIG. 3 shows a first example configuration 300 including a first substrate processing tool 304 and a second substrate processing tool 308. The first substrate processing tool 304 and the second substrate processing tool 308 are arranged sequentially and are connected by a transfer stage 312, which is under vacuum. As shown, the transfer stage 312 includes a pivoting transfer mechanism configured to transfer substrates between a vacuum transfer module (VTM) 316 of the first substrate processing tool 304 and a vacuum transfer module (VTM) 320 of the second substrate processing tool 308. However, in other examples, the transfer stage 312 may include other suitable transfer mechanisms, such as a linear transfer mechanism, In some examples, a first robot (not shown) of the VTM 316 may place a substrate on a support 324 arranged in a first position, the support 324 is pivoted to a second position, and a second robot (not shown) of the VTM 320 retrieves the substrate from the support 324 in the second position. In some examples, the second substrate processing tool 308 may include a storage buffer 328 configured to store one or more substrates between processing stages.

The transfer mechanism may also be stacked to provide two or more transfer systems between the substrate processing tools 308 and 304. Transfer stage 312 may also have multiple slots to transport or buffer multiple substrates at one time.

In the configuration 300, the first substrate processing tool 304 and the second substrate processing tool 308 are configured to share a single equipment front end module (EFEM) 332.

Figure 4:
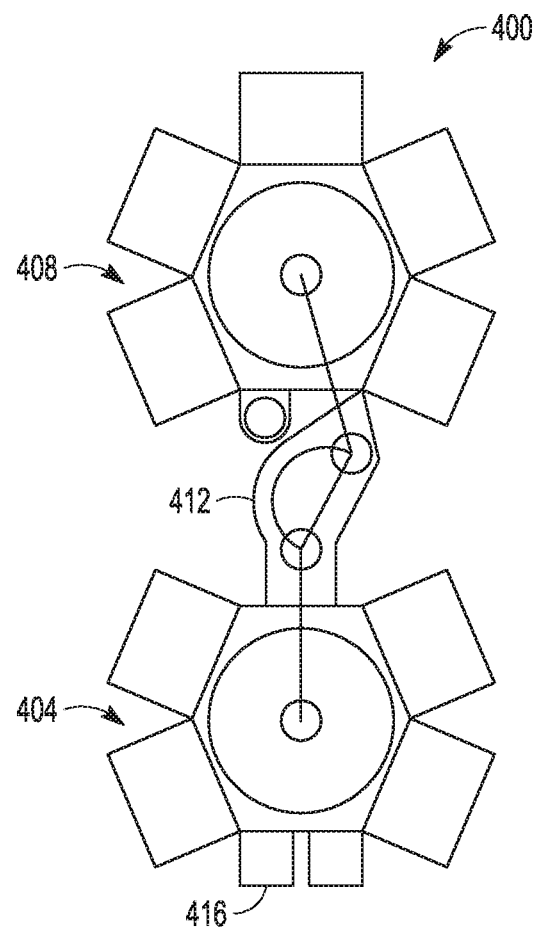

FIG. 4 shows a second example configuration 400 including a first substrate processing tool 404 and a second substrate processing tool 408 arranged sequentially and connected by a transfer stage 412. The configuration 400 is similar to the configuration 300 of FIG. 3 except that in the configuration 400, the EFEM 332 is eliminated. Accordingly, substrates may be loaded into the first substrate processing tool 404 directly via airlock loading stations 416 (e.g., using a storage or transport carrier such as a vacuum wafer carrier, front opening unified pod (FOUP), an atmospheric (ATM) robot, etc., or other suitable mechanisms).

Figure 5:
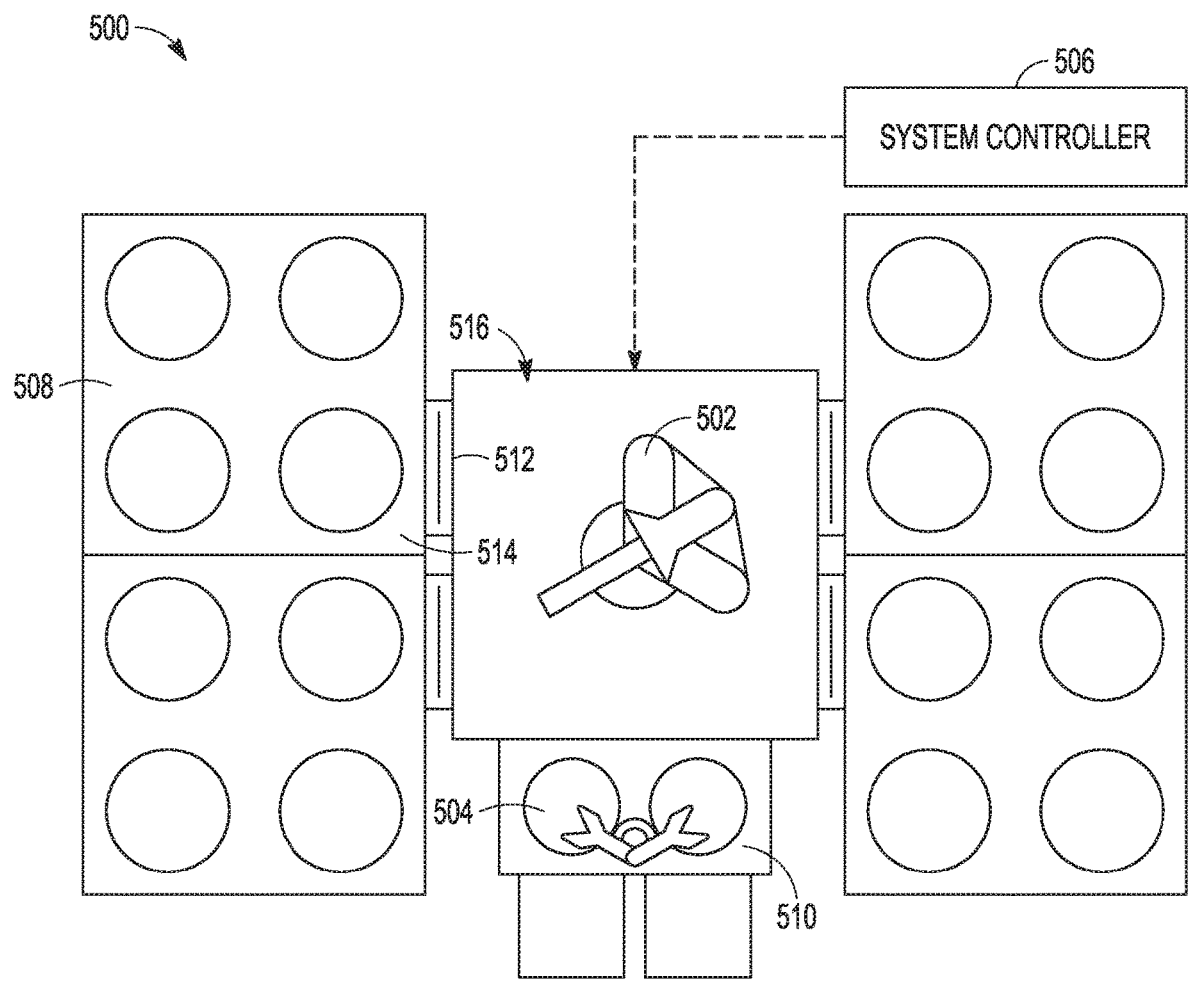
FIG. 5 is a schematic view of an example substrate processing tool including a quad station process module in which example foreline assemblies of the present disclosure may be deployed.

A foreline assembly of the present disclosure may be deployed in quad station process modules (QSMs). In some examples, as shown in FIG. 5, a quad station process module is provided. A substrate processing tool 500 includes four process modules (or process chambers) 508 disposed at respective corner stations in the substrate processing tool 500. Other arrangements of the process modules 508 are possible. The substrate processing tool 500 includes transfer robots 502 and 504, referred to collectively as transfer robots 502/504. The processing tool 500 is shown without mechanical indexers for example purposes. In other examples, the respective process modules 508 of the tool 500 may include mechanical indexers.

A VTM 516 and an EFEM 510 may each include one of the transfer robots 502/504. The transfer robots 502/504 may have the same or different configurations. In some examples, the transfer robot 502 is shown having two arms, each having two vertically stacked end effectors. The robot 502 of the VTM 516 selectively transfers substrates to and from the EFEM 510 and between the process modules 508. The robot 504 of the EFEM 510 transfers substrates into and out of the EFEM 510. In some examples, the robot 504 may have two arms, each arm having a single end effector or two vertically stacked end effectors. A system controller 506 may control various operations of the illustrated substrate processing tool 500 and its components including, but not limited to, operation of the robots 502/504, and rotation of the respective indexers of the process modules 508, and so forth.

The tool 500 is configured to interface with, for example, each of the four process modules 508. Each process module 508 may have a single load station accessible via a respective slot 512. In this example, sides 514 of the VTM 516 are not angled (i.e., the sides 514 are substantially straight or planar). Other arrangements are possible. In the illustrated manner, two of the process modules 508, each having a single load station, is coupled to each of the sides 514 of the VTM 516. Accordingly, the EFEM 510 may be arranged at least partially between two of the process modules 508.

During substrate processing in a process module 508, processing gases enter the module to assist in creating a plasma, for example. The gases are then exit the process module 508. The expulsion of exhaust gases may be performed by a vacuum or exhaust line, also referred to as a foreline in this specification. One of more forelines in a foreline assembly may be situated underneath each processing module 508 and be connected to a vacuum source to expel gases from the process module 508.

Figure 6:
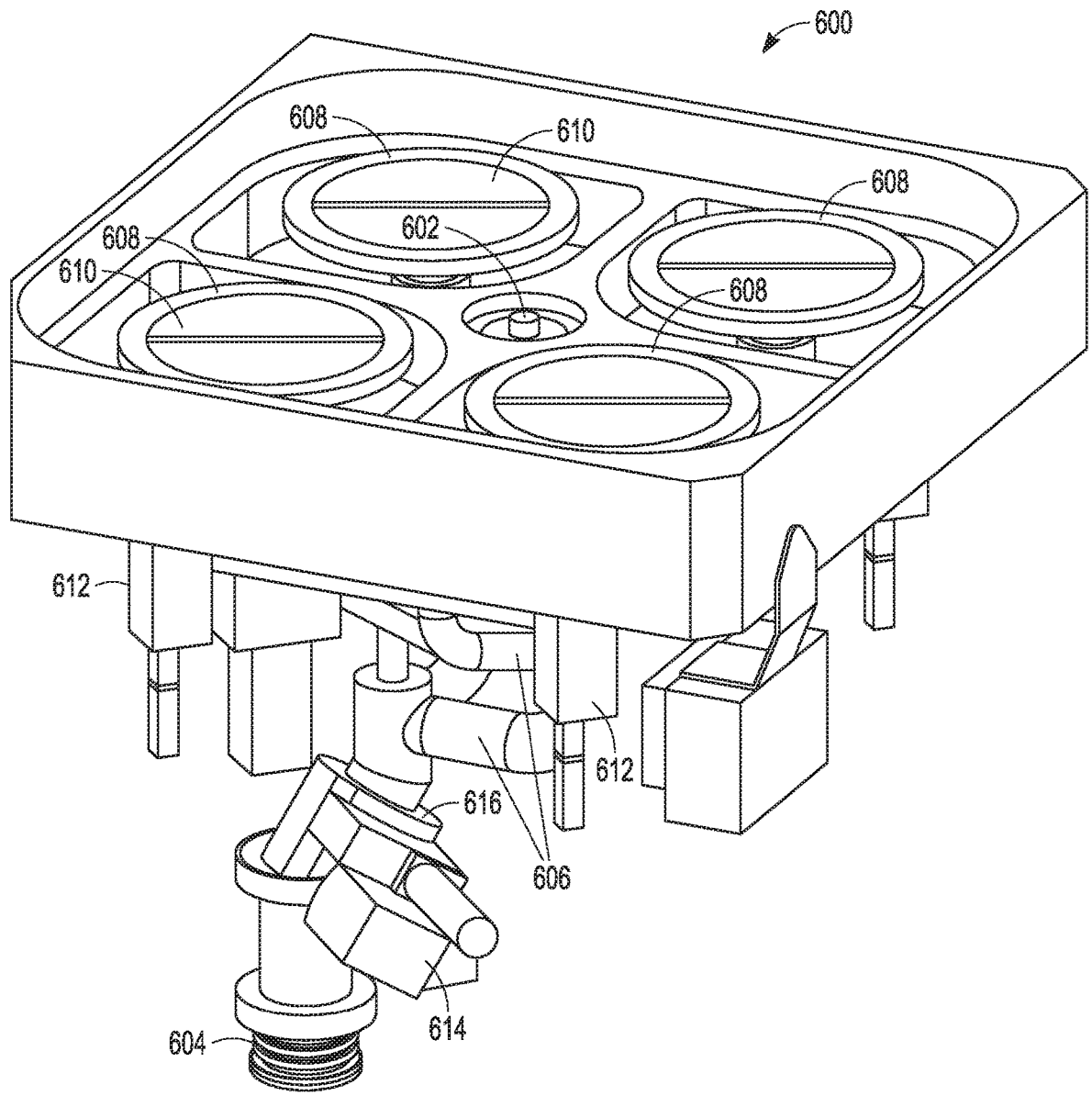
FIGS. 6-8 show example configurations of a foreline assembly and related componentry fitted to a QSM, according to example embodiments.
Figure 7:
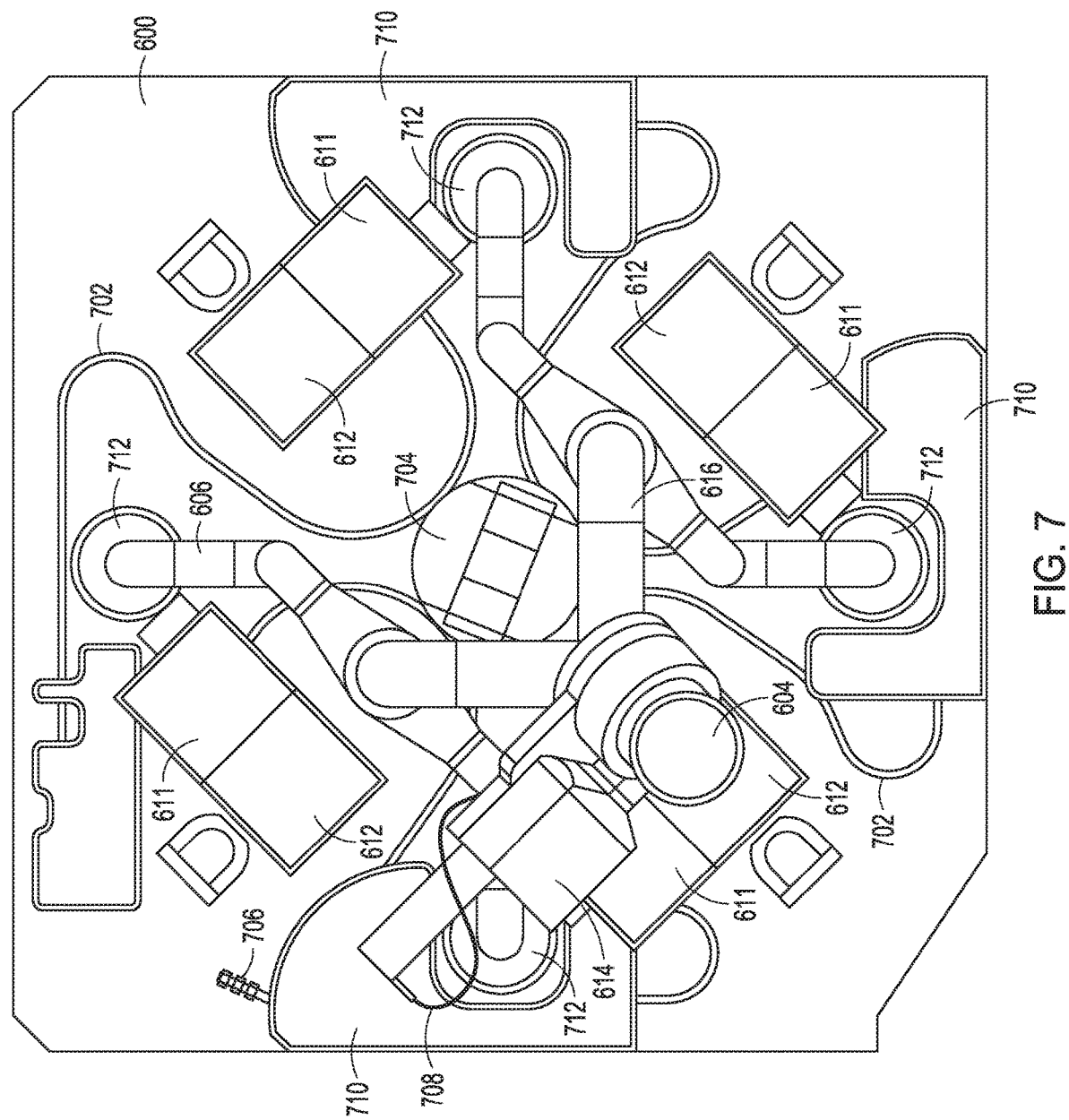
Figure 8:
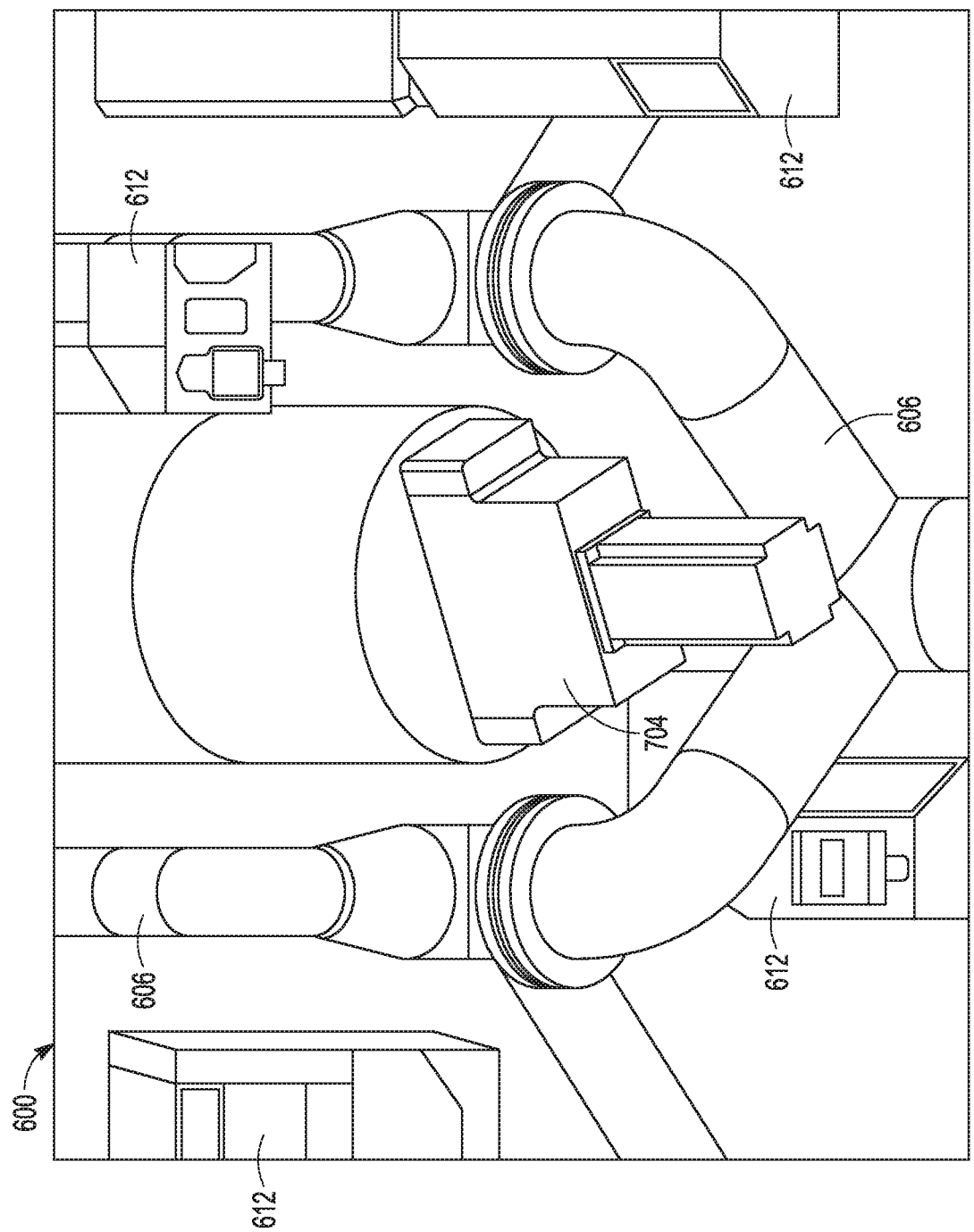

FIGS. 6-8 generally show an example configuration of a foreline assembly 606 and related componentry fitted to the underside of a QSM 600. An example QSM 600 is shown pictorially in FIG. 6. Some QSM 600 parts are omitted for clarity. The QSM 600 includes four process modules (or process chambers, or process stations) 608 disposed in a generally square-shaped configuration at respective corner stations of the QSM 600. Other arrangements of the process modules 608 are possible. Each process module 608 in the QSM 600 includes a wafer support 610 which supports a substrate or wafer during processing. In some examples, the wafer support 610 includes a pedestal or a chuck. Other types of wafer support or components may be used to support wafers in a process module 608 to perform different types of processes on them.

Each process module 608 includes a respective lift pin actuator assembly 612 which can move lift pins upward and unseat a wafer during wafer transfer. A lift pin actuator assembly 612 may include an eDSC. In some examples, an eDSC is a component generally positioned outside a process chamber and below each station 608 and interacts with a pedestal 610 and its support mechanism.

The substrate processing tool 600 includes a spindle 602 that can transfer wafers from one wafer support 610 to another. The spindle 602 may be driven by a spindle motor 704 visible more clearly in FIG. 7. For clarity, a transfer plate on which the spindle 602 can act is not pictured in the view. The transfer plate may be rotated during a wafer transfer phase and the movement of a wafer during this phase may be coordinated with wafer movements imparted by other wafer transfer mechanisms, for example the transfer robots 502/504 of FIG. 5.

A section of a foreline assembly 606 is visible below the QSM 600 in FIG. 6. This section is a "third section" of the foreline assembly and is described in more detail below. The foreline assembly 606 includes a lower outlet 616 connectable directly or indirectly to a vacuum source 604 and other downstream components such a combination or control valve 614. During wafer processing, the foreline assembly 606 evacuates exhaust gases from each of the process modules 608 (process chambers) and the QSM as a whole during wafer or substrate processing.

FIG. 7 is a schematic view of an underside and related components of the QSM 600. Underside views of the foreline assembly 606 and the lift pin actuator assemblies 612 may be seen. An RF filter box 611 is attached to each lift pin actuator assembly 612. As described in more detail below, each (upper) inlet 712 of the foreline assembly 606 is connected to a respective process module (chamber) 608 at a respective chamber port.

It may be noted that the illustrated configuration of the foreline assembly 606 allows room for the orientation of the lift pin actuator assemblies 612 relative to the axis of the spindle 602 (or spindle motor 704) to remain the same i.e. they follow an imaginary concentric ring around the spindle 602 in the same direction. The (lower) outlet 616 of the foreline assembly 606 is connectable directly or indirectly to a vacuum source 604 and the control valve 614. The QSM 600 may include various components and supply lines 702, connectors 706, control wiring 708, and other modules 710 to supply the QSM 600, as shown. Other componentry and QSM arrangements are possible.

FIG. 8 shows a further pictorial view of an example foreline assembly 606 fitted to the underside of a QSM 600. The foreline assembly 606, the spindle motor 704, and the lift pin actuator assemblies 612 are again visible in the view. It may be noted that the illustrated configuration of the foreline assembly 606 allows considerable clearance around the spindle motor 704 and other process support components positioned underneath the QSM 600. This clearance and the consistent orientation of the lift pin actuator assemblies 612 discussed above may enable replacement part uniformity and ease of access to the QSM 600 for operators during maintenance of the QSM 600 or between wafer processing cycles.

Figure 9:
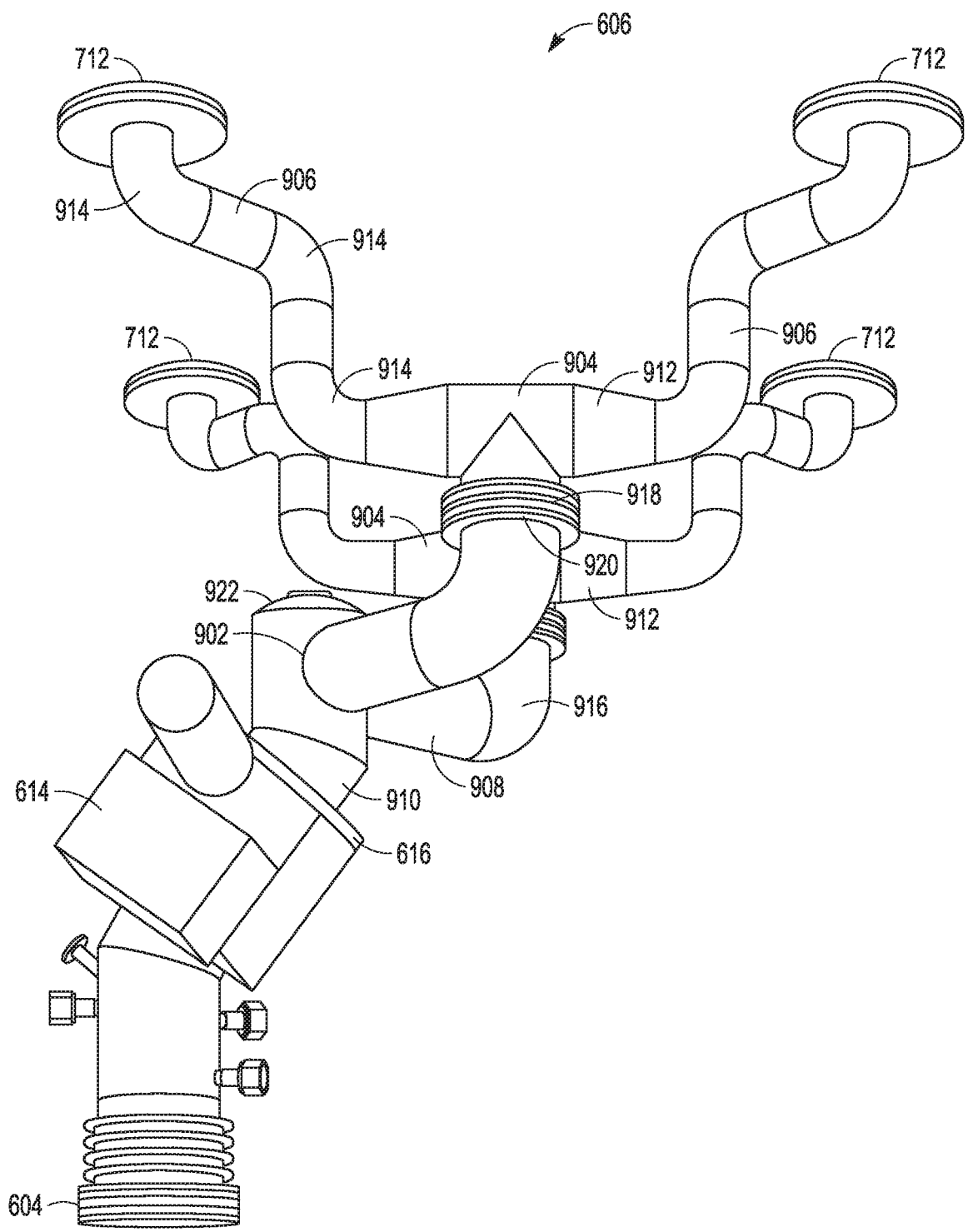
FIGS. 9-10 show pictorial views of a foreline assembly (for clarity not fitted to a QSM), according to example embodiments.
Figure 10:
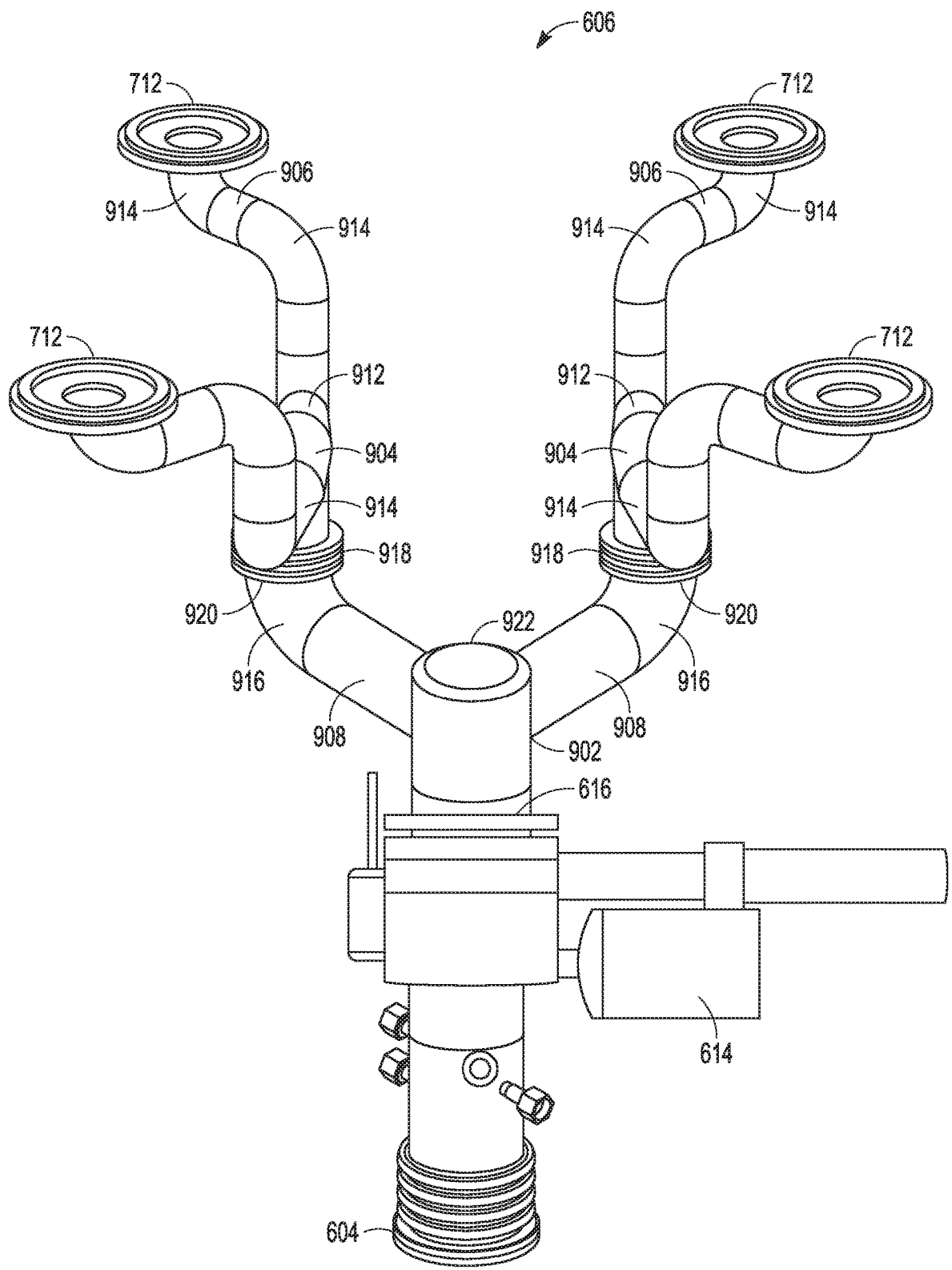

FIGS. 9-10 show pictorial views of a foreline assembly 606 not fitted to a QSM. The illustrated foreline assembly 606 includes four inlets that include, in this example, chamber ports 712. Other inlet numbers or configurations are possible depending on process requirements. For example, a 2-inch inlet 712 may include a 4-inch chamber port to facilitate unmodified fitting of a foreline assembly 606 to the existing ports in an in-situ process module (chamber) 608. An outlet 616 of the foreline assembly 606 is connectable directly or indirectly to a vacuum source at 604. A vacuum pressure and exhaust gas flow though the foreline assembly 606 can be regulated by a control valve, such as a combination control valve 614.

In some examples, the forelines in a foreline assembly 606 include three bifurcations. For example, a first or main bifurcation 902 is provided proximate the outlet 616. At the first bifurcation 902, a relatively large diameter pipe section joins two relatively smaller pipe sections 908, as illustrated in the example of FIG. 9. The respective diameters of the two (now bifurcated) forelines 908 nearer the process modules 608 may be approximately the same, as shown in the view for example. In some examples, the respective pipe diameters may be different depending on processing flow or pressure requirements. The first bifurcation 902 may include a plenum chamber 922 to equalize vacuum pressure for more even distribution into the bifurcated forelines 908. From the alternate perspective of the direction of exhaust gas flow outwardly down from the process modules 908, the two forelines 908 upstream of the first bifurcation 902 merge into one line and the exhaust gases form one gas stream.

Two second bifurcations 904 of the foreline assembly are disposed between the first bifurcation 902 and respective pairs of the inlets 712, as shown. Only one of the two second bifurcations 904 is fully visible in the view of FIG. 9. In some examples, the first and second bifurcations 902 and 904 divide the forelines of the foreline assembly 606 into sections: a first section 906 extending from the inlets 712 to the two second bifurcations 904, a second section 908 extending from the second bifurcations 904 to the first bifurcation 902, and a third section 910 extending from the first bifurcation 902 to the outlet 616 of the foreline assembly 606.

A diameter of a foreline in the first section 906 may be in the range 38.1 mm (approximately 1.5 inches) to 63.5 mm (approximately 2.5 inches). A diameter of a foreline in the second section 908 may be in the range 63.5 mm (approximately 2.5 inches) to 88.9 mm (approximately 3.5 inches). A diameter of a foreline in the third section 910 may be in the range 88.9 mm (approximately 3.5 inches) to 114.3 mm (approximately 4.5 inches). In the illustrated example, a 2-3-4 foreline assembly 606 is shown, denoting the use of a 2-inch line in the first section 906, a 3-inch line in the second section 908, and a 4-inch line in the third section 910 of the foreline assembly 606. Other line configurations are possible. In some examples, the diameter of each line in each section 906, 908 and 910 between an inlet 712 or a connector is substantially uniform throughout.

In some examples, a T-piece connector 912 is provided at each second bifurcation 904. An example T-piece connector 912 may include two outwardly converging conical sections, as shown, that transition the diameter of the 3-inch foreline to the 2-inch foreline (or vice versa in the direction of exhaust gas flow). In some examples, a position of or a separation distance between the T-piece connector 912 and an underside of a QSM 600 may be selected to accommodate other components, for example a lift pin actuator assembly 612, an RF filter box 611, a spindle motor 704, an mDSC motor, or an eDSC motor.

In the first section 906, the foreline assembly 606 includes four forelines that each include three substantially right-angled elbows 914 disposed at intervals along the forelines. The elbows are provided between each inlet 712 and a respective second bifurcation 904. In some examples, the forelines in the first section 906 are generally continuous and no separable joints or unions are provided. Other arrangements are possible.

In the second section 908, the foreline assembly 606 includes two forelines that each include one substantially right-angled elbow 916 disposed between the first 902 and second 904 bifurcations. In some examples, a separable union 918 is provided at or towards an upper end of each elbow 916. Each union 918 may include, as shown, two opposed flanges 920 that can be bolted together to join each elbow 916 to an exit port of the T-piece connector 912. The flanges 920 lie in horizontal planes and their positioning above an elbow 916 creates a symmetry for both halves of the second section 908 in the sense that different "right-handed" or "left-handed" elements in the second section 908 are avoided. The horizontal orientation of the flanges 920 also allow an operator ease of access to nuts or bolts passing vertically through the flanges 920 to secure the union 918 since the nuts or bolts can be accessed from directly underneath the QSM 600, as opposed to requiring a lateral space in order to do so. This horizontal orientation of the union 918 and flanges 920, together with the aforementioned improved clearance around the spindle motor 704, further assist ease of operator maintenance of a QSM 600.

The third section 910 of the foreline assembly 606 may include the plenum chamber 922 referenced above and a relatively short length of large diameter foreline extending from the plenum chamber 922 to the outlet 616 of the foreline assembly 606.

Figure 11:
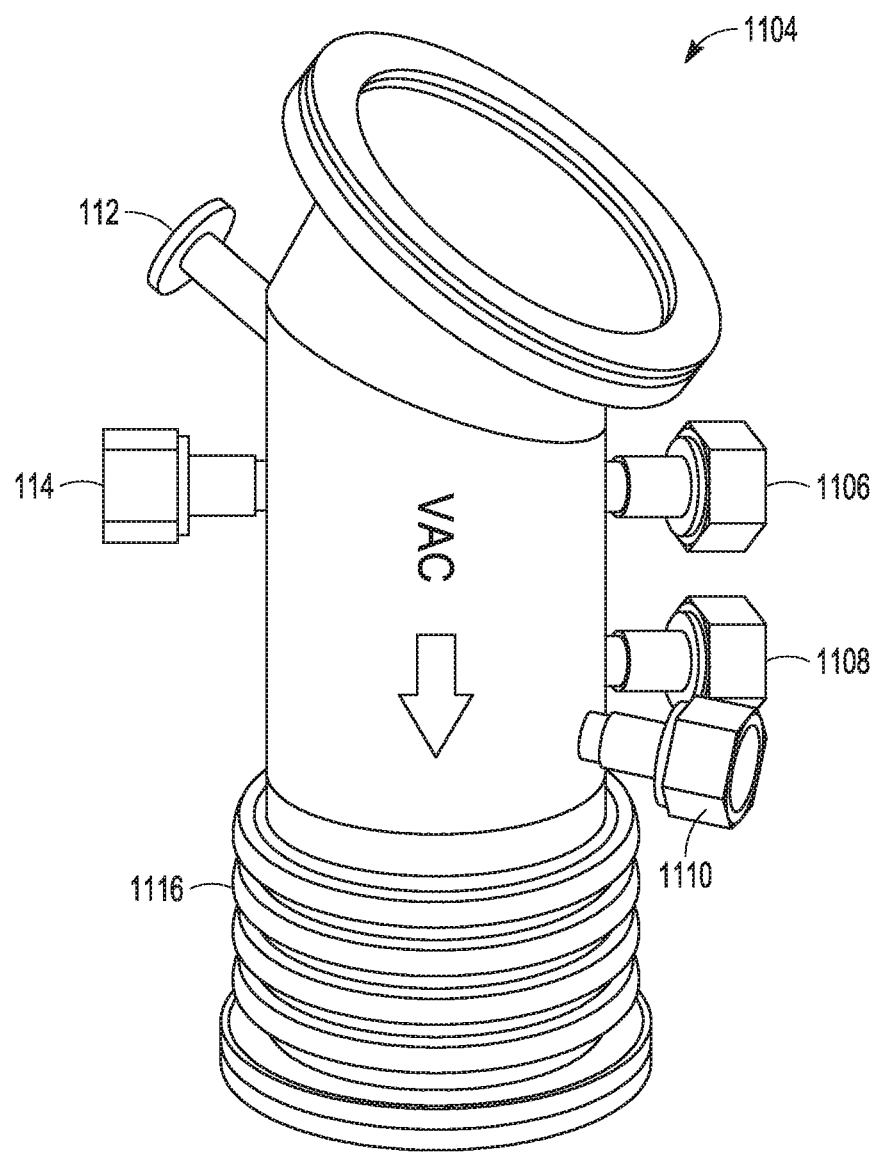
FIG. 11 shows a pictorial view of a spool piece, according to an example embodiment.

With reference to FIG. 11, in some examples a foreline assembly 606 includes or is connectable to a spool piece 1104. The spool piece 1104 may be interposed between a vacuum source 604 and the outlet 616 of the foreline assembly 606. For convenience, an example spool piece 1104 may include an indicator 1102 pointing to a direction of the vacuum source 604. In some examples, a spool piece 1104 includes a slow-pump inlet 1106, a TEOS divert 1108, and a gas box divert 1110. In some examples, a spool piece 1104 includes a precursor or other divert 1112, a Hastings gauge port 1114, and a bellows 1116 to facilitate operator serviceability and ease of adjustment of the spool piece 1104.

Figure 12:
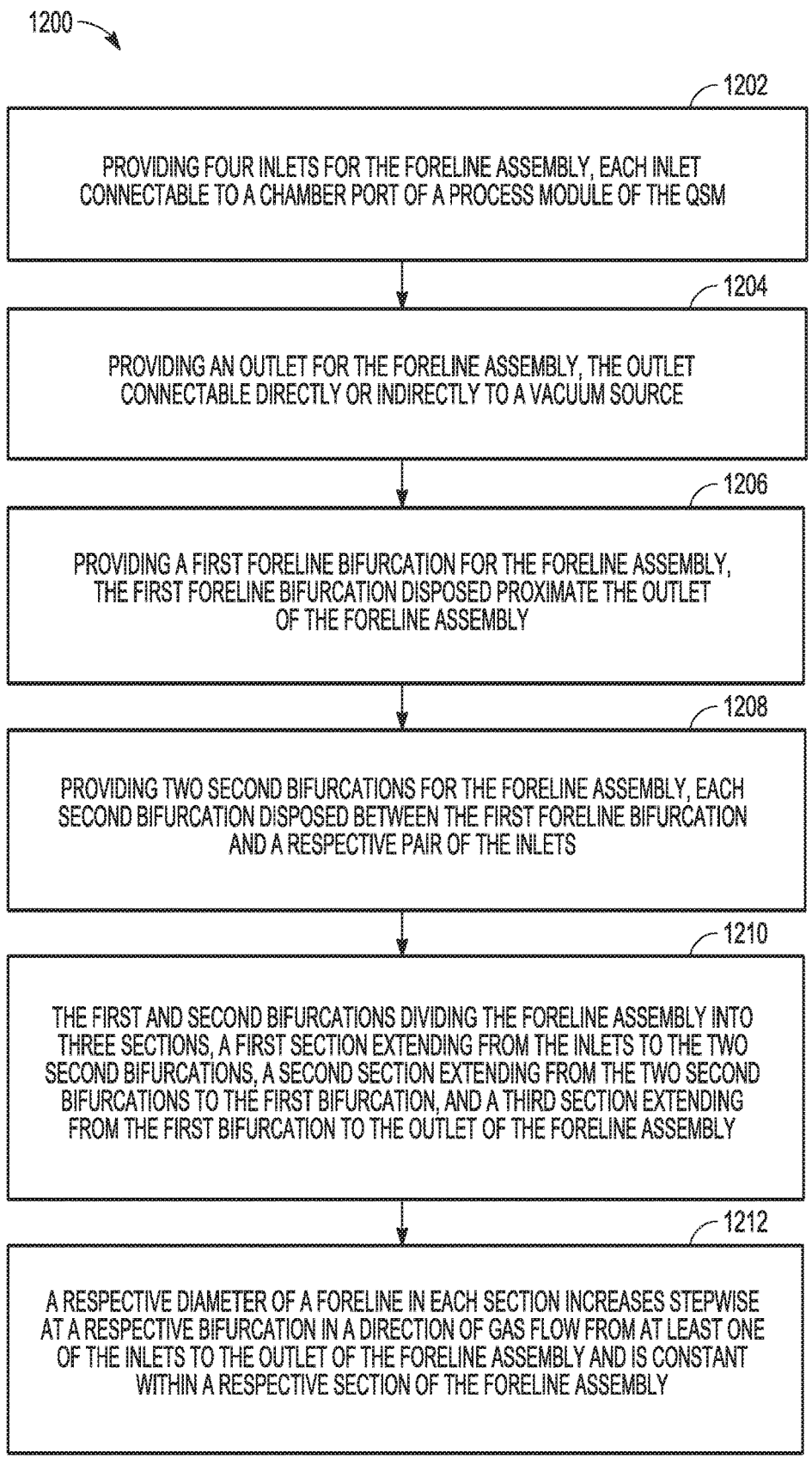
FIG. 12 is a flow chart showing operations in a method, according to an example embodiment.

Some embodiments include methods. With reference to FIG. 12, a method 1200 of making a foreline assembly for a QSM comprises: at operation 1202, providing four inlets for the foreline assembly, each inlet connectable to a chamber port of a process module of the QSM; at operation 1204, providing an outlet for the foreline assembly, the outlet connectable directly or indirectly to a vacuum source; at operation 1206, providing a first foreline bifurcation for the foreline assembly, the first foreline bifurcation disposed proximate the outlet of the foreline assembly; at operation 1208, providing two second bifurcations for the foreline assembly, each second bifurcation disposed between the first foreline bifurcation and a respective pair of the inlets; wherein at 1210, the first and second bifurcations dividing the foreline assembly into three sections, a first section extending from the inlets to the two second bifurcations, a second section extending from the two second bifurcations to the first bifurcation, and a third section extending from the first bifurcation to the outlet of the foreline assembly; and wherein at 1212, a respective diameter of a foreline in each section increases stepwise at a respective bifurcation in a direction of gas flow from at least one of the inlets to the outlet of the foreline assembly, and is constant within a respective section of the foreline assembly.

In some examples, the method 1200 further comprises providing a diameter of a foreline in the first section in the range 38.1 mm (approximately 1.5 inches) to 63.5 mm (approximately 2.5 inches), providing a diameter of a foreline in the second section in the range 63.5 mm (approximately 2.5 inches) to 88.9 mm (approximately 3.5 inches), and providing a diameter of a foreline in the third section in range 88.9 nun (approximately 3.5 inches) to 114.3 mm (approximately 4.5 inches).

In some examples, the method 1200 further comprises providing the diameter of the foreline in the first section at 50.8 mm (approximately 2 inches), providing the diameter of the foreline in the second section at 76.2 mm (approximately 3 inches), and providing the diameter of the foreline in the third section at 101.6 mm (approximately 4 inches).

In some examples, the method 1200 further comprises providing a T-piece connector at each of the second bifurcations.

In some examples, the method 1200 further comprises including in the T-piece connector at least one outwardly converging conical section that transitions the diameter of a foreline in the first section to the diameter of a foreline in the second section.

Although examples have been described with reference to specific example embodiments or methods, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. A foreline assembly for a quad station process module (QSM), the foreline assembly comprising:
   four inlets each connectable to a chamber port of a process module of the QSM;
   an outlet connectable directly or indirectly to a vacuum source;
   a first bifurcation disposed proximate the outlet of the foreline assembly; and
   two second bifurcations, each disposed between the first bifurcation and a respective pair of the inlets, wherein each of the two second bifurcations includes a horizontal section, a first vertical axis perpendicular to the horizontal sections and passing through a center point between the two horizontal sections;
   the first and second bifurcations dividing the foreline assembly into three sections, a first section extending downwards from the inlets then extending inwards towards the center point equidistant from the four inlets and then extending downwards to respective one of the two second bifurcations, a second section extending from respective one of the two second bifurcations downwards to the first bifurcation, and a third section extending from the first bifurcation to the outlet of the foreline assembly, a second vertical axis passing through the first bifurcation and being parallel to the first vertical axis; and
   wherein a respective diameter of a foreline in each section:
   increases stepwise at a respective bifurcation in a direction of gas flow from at least one of the inlets to the outlet of the foreline assembly, and
   is constant within a respective section of the foreline assembly.

2. The foreline assembly of claim 1, wherein a diameter of a foreline in the first section is in a range 38.1 mm (approximately 1.5 inches) to 63.5 mm (approximately 2.5 inches), a diameter of a foreline in the second section is in a range 63.5 mm (approximately 2.5 inches) to 88.9 mm (approximately 3.5 inches), and a diameter of a foreline in the third section is in a range 88.9 mm (approximately 3.5 inches) to 114.3 mm (approximately 4.5 inches).

3. The foreline assembly of claim 2, wherein the diameter of the foreline in the first section is 50.8 mm (approximately 2 inches), the diameter of the foreline in the second section is 76.2 mm (approximately 3 inches), and the diameter of the foreline in the third section is 101.6 mm (approximately 4 inches).

4. The foreline assembly of claim 1, further comprising a T-piece connector provided at each of the second bifurcations.

5. The foreline assembly of claim 4, wherein the T-piece connector includes outwardly converging conical sections that transition a diameter of a foreline in the first section to a diameter of a foreline in the second section.

6. The foreline assembly of claim 4, wherein a separation distance between the T-piece connector and an underside of the QSM is configured to accommodate a component between the T-piece connector and underside of the QSM.

7. The foreline assembly of claim 1, wherein the first section of the foreline assembly includes four forelines each including three substantially right-angled elbows disposed at intervals along the forelines.

8. The foreline assembly of claim 7, wherein each elbow is provided between a respective inlet and a respective second bifurcation.

9. The foreline assembly of claim 7, wherein the forelines in the first section are generally continuous and devoid of separable joints or unions.

10. The foreline assembly of claim 1, wherein the second section of the foreline assembly includes two forelines that each include one substantially right-angled elbow disposed between the first bifurcation and a respective second bifurcation.

11. The foreline assembly of claim 10, further comprising a separable union provided at or towards an upper end of each right-angled elbow.

12. The foreline assembly of claim 11, wherein each union includes two opposed flanges.

13. The foreline assembly of claim 12, wherein the opposed flanges each lie in a horizontal plane when fitted to the QSM.

14. The foreline assembly of claim 1, wherein the third section of the foreline assembly includes a plenum chamber, the plenum chamber provided at the first bifurcation.

15. The foreline assembly of claim 1, further comprising a spool piece, the spool piece including one or more of an inlet of a slow-pump, a divert for tetraethyl orthosilicate or tetraethoxysilane (TEOS), a divert of a gas box, a divert for a precursor or another gas, a port of a Hastings gauge, and a bellows.

* * * * *